(12) United States Patent
Kordina

(10) Patent No.: US 7,147,713 B2
(45) Date of Patent: Dec. 12, 2006

(54) PHASE CONTROLLED SUBLIMATION

(75) Inventor: Olof Claes Erik Kordina, Butler, PA (US)

(73) Assignee: Cree, Inc., Durham, NC (US)

( * ) Notice: Subject to any disclaimer, the term of this patent is extended or adjusted under 35 U.S.C. 154(b) by 369 days.

(21) Appl. No.: 10/426,200

(22) Filed: Apr. 30, 2003

(65) Prior Publication Data
US 2004/0216661 A1 Nov. 4, 2004

(51) Int. Cl.
C30B 23/00 (2006.01)
(52) U.S. Cl. .............. 117/84; 117/88; 117/89; 117/91; 117/99; 117/951
(58) Field of Classification Search .............. 117/84, 117/88, 89, 91, 99, 951
See application file for complete search history.

(56) References Cited

U.S. PATENT DOCUMENTS

| 3,617,398 | A | | 11/1971 | Bilous et al. | |
|---|---|---|---|---|---|
| 3,920,799 | A | | 11/1975 | Wiebke et al. | |
| 3,925,577 | A | | 12/1975 | Fatzer et al. | |
| 4,634,601 | A | | 1/1987 | Hamakawa et al. | |
| 5,248,385 | A | | 9/1993 | Powell | |
| 5,254,370 | A | | 10/1993 | Nagasawa et al. | |
| 5,288,326 | A | * | 2/1994 | Maeda et al. | 118/719 |
| 5,612,132 | A | | 3/1997 | Goela et al. | |
| 5,704,985 | A | * | 1/1998 | Kordina et al. | 118/725 |
| 5,915,194 | A | | 6/1999 | Powell et al. | |
| 6,039,812 | A | | 3/2000 | Ellison et al. | 118/725 |
| 6,063,186 | A | | 5/2000 | Irvine et al. | 117/89 |
| 6,297,522 | B1 | | 10/2001 | Kordina et al. | 257/77 |
| 6,620,518 | B1 | | 9/2003 | Lavery et al. | |
| 6,665,476 | B1 | | 12/2003 | Braun et al. | |

2002/0197761 A1   12/2002   Patel et al.

FOREIGN PATENT DOCUMENTS

| DE | 44 32 813 A1 | 3/1996 |
|---|---|---|
| EP | 0 554 047 A1 | 8/1993 |
| EP | 0 835 336 B1 | 9/2000 |
| WO | WO 00/43577 | 7/2000 |
| WO | WO 01/27361 A1 | 4/2001 |

OTHER PUBLICATIONS

Chen, et al., "Improvement of 3C-SiC Surface Morphology on Si(100) by Adding HCl using Atmospheric CVD," Materials Science Forum vols. 338-342, pp. 257-260.

Gao, et al., "Low-temperature chemical-vapor deposition of 3C-SiC films on Si(1 0 0) using $SiH_4$-$C_2H_4$-$HCl$-$H_2$," Journal of Crystal Growth 191 (1998) pp. 439-445.

Powell, et al., "SiC Materials—Progress, Status, and Potential Roadblocks," Proceedings of the IEEE, vol. 90, No. 6, Jun. 2002, pp. 942-955.

(Continued)

Primary Examiner—Yogendra N. Gupta
Assistant Examiner—Matthew J. Song
(74) Attorney, Agent, or Firm—Myers Bigel Sibley & Sajovec

(57) ABSTRACT

A method of forming a silicon carbon compound. A silicon source is introduced into an environment. Silicon particles are formed therefrom. One or more hydrocarbons are introduced into the environment separately from the silicon source, thereby forming one or more silicon carbon compounds. A dissociation enhancer may be introduced into the environment to minimize silicon particle size prior to it joining the hydrocarbon source.

30 Claims, 1 Drawing Sheet

OTHER PUBLICATIONS

Chaudhry, et al., "The Role of Carrier Gases in the Epitaxial Growth of β-SiC on Si by CVD," Journal of Crystal Growth, 113 (1991) Aug. Nos. 1/2, Amsterdam, NL, pp. 121-126.

Kimoto, et al., "Recent Achievements and Future Challenges In SiC Homoepitaxial Growth," Materials Science Forum, vols. 389-393 (2002) pp. 165-170.

Masuda, et al., "Surface Morphology of 4H-SiC Inclined towards <1100> and <1120> Grown by APCVD Using the $Si_2Cl_6+C_3H_8$ System," Materials Science Forum vols. 353-356 (2001) pp. 139-142.

Barrett, et al., "Growth of Large SiC Single Crystals," *Journal of Crystal Growth*, vol. 128, pp. 358-362, (1993).

Ellison, et al., "Fast SiC Epitaxial Growth in a Chimney CVD Reactor and HTCVD Crystal Growth Developments," *Materials Science Forum*, vols. 338-342, pp. 131-136 (2000).

Ellison, et al., "HTCVD Growth of Semi-Insulating 4H-SiC Crystals with Low Defect Density," *Mat. Res. Soc. Symp.*, vol. 640, pp. H1.2.1-H1.2.11, (2001).

Ellison, et al., "HTCVD Grown Semi-Insulating SiC Substrates," *Materials Science Forum*, vols. 433-436, pp. 33-38, (2003).

Sundqvist, et al., "Growth of High Quality p-Type 4H-SiC Substrates by HTCVD," *Materials Sicence Forum*, vols. 433-436, pp. 21-24 (2003).

Tairov, et al., "Investigation of Growth Processes of Ingots of Silicon Carbide Single Crystals," *Journal of Crystal Growth*, vol. 43, pp. 209-212, (1978).

International Search Report for PCT/US04/13057, dated Jan. 31, 2006 with a mailing date of Mar. 10, 2006.

* cited by examiner

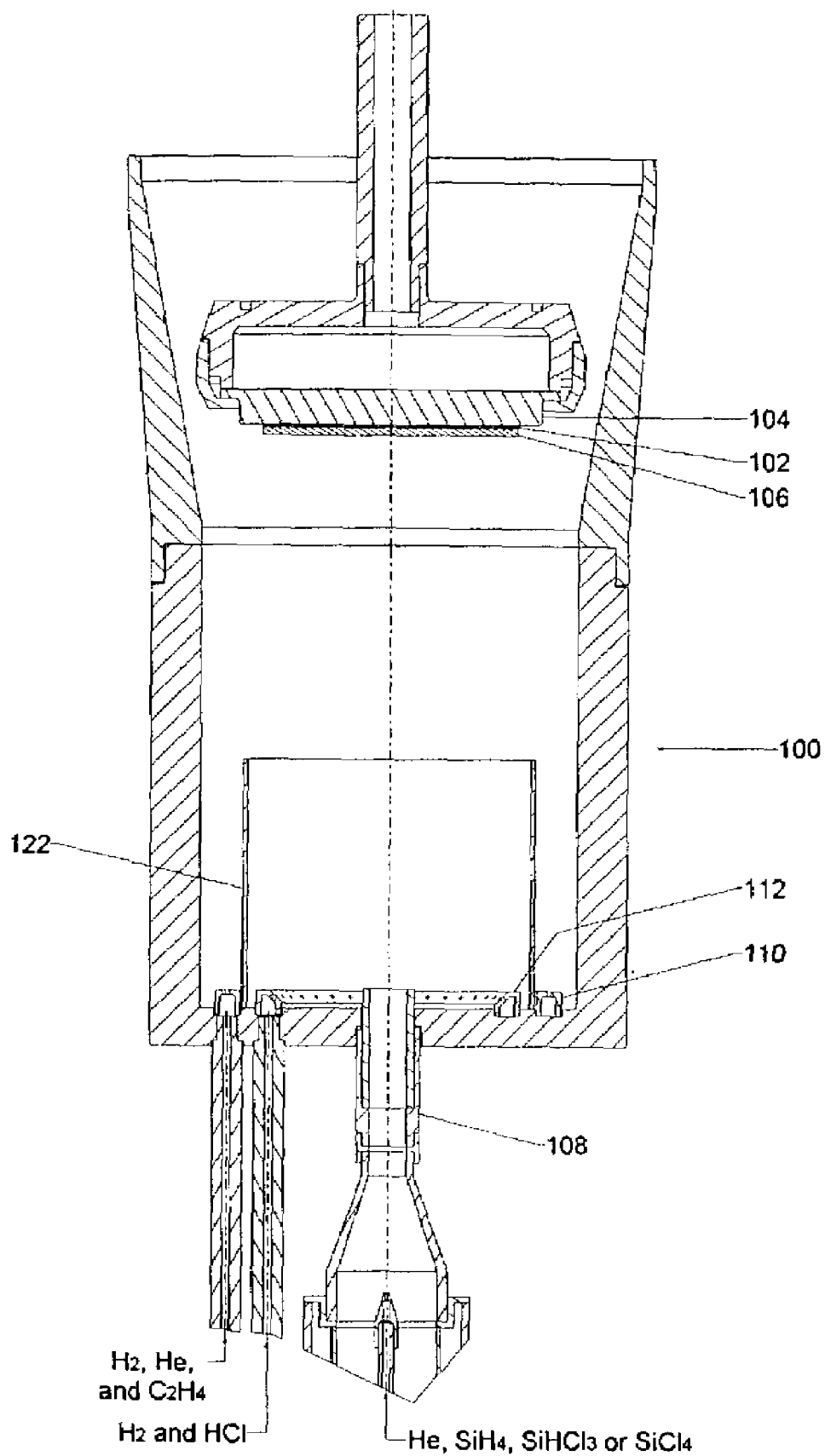

PHASE CONTROLLED SUBLIMATION

FIELD OF THE INVENTION

The invention relates to crystal growth, and more particularly to silicon carbide crystal growth.

BACKGROUND OF THE INVENTION

Silicon carbide (SiC) is a semiconductor material with properties highly suitable for high power, high frequency, and high temperature applications. Its wide bandgap make it suitable for high temperature applications and also as a substrate for optoelectronic applications where blue and UV light is desired. Many applications require a very high quality SiC crystal to minimize device defects and failures. Such high quality silicon carbide is difficult to produce in an efficient manner. Technical obstacles have remained that have inhibited the widespread use of silicon carbide. Reduction in defects must be achieved to realize the full potential of silicon carbide in the electronics industry. Silicon carbide substrates are typically perforated by tiny holes called micropipes at a density of 15–30 mp/cm$^2$ on good material. The diameter is also small, only 3" on commercially available material. To make a viable business low cost, high quality, four-inch (minimum) wafers must be produced.

The standard way of growing SiC is by seeded sublimation growth. A graphite crucible is filled with SiC powder and a SiC single crystal seed is attached to the lid of the crucible, which is then sealed. The system is heated to temperatures above 2000° C. where SiC sublimes. Temperatures must be quite high to make sure the SiC powder sublimes appreciably. If a thermal gradient is applied such that the seed is colder than the source material, transport will take place from the source to the seed. If the pressure is lowered to a few torr, the material transport is enhanced. Unfortunately, the method has some drawbacks. Micropipe density is significant. Purity is also often a problem. Due to the way the thermodynamics work for the sublimation, the growth is generally rich in silicon (Si) at the beginning, with diminishing amount of Si at the end of the growth. This has severe implications on the yield of semi-insulating wafers since the material will be n-type at the start of the growth and p-type at the end.

The length of the grown crystals, commonly called boules, is also limited to the amount of silicon carbide source material in the system. Typical boule lengths are 20–25 mm.

High Temperature Chemical Vapor Deposition (HTCVD) can also be used to produce silicon carbide crystals. Gases carrying the Si and C needed for the growth replace a powder source material. In the entrance region, silane and ethylene react and nucleate in the gas phase to form microparticles of $Si_xC_y$. Carbon is sometimes omitted and is then grabbed from graphite walls of the crucible. Micro-particles of SiC are formed and are moved into a main chamber where the temperature is much higher. Here the particles sublime and move towards a colder substrate through the aid of a carrier gas and the thermal gradient.

Unlike seeded sublimation growth, HTCVD is an open system, and is therefore run at significantly higher pressures to avoid problems with sublimation (evaporation) of the sample.

Material properties of HTCVD grown silicon carbide are usually much better than that of the sublimation grown crystals, however, the defect density could still use improvement, growth rates are low (<1 mm/hr), and temperatures are high which stresses the crucible and insulation materials making the system drift.

Accordingly, there is a need for a lower temperature silicon carbide growth method that produces high quality crystals with a minimum amount of defects, and at higher growth rates (greater than 1 mm/hr).

SUMMARY OF THE INVENTION

Embodiments of the present invention include a method of forming a silicon carbon compound. A silicon source is introduced into an environment such as the inlet to a HTCVD chamber. Silicon particles or droplets are formed from the silicon source. Hydrogen chloride is preferably introduced separately into the hot zone to reduce the size of the silicon particles before they meet with the hydrocarbon source that is also brought in separately. The purpose is to minimize the size of the $Si_xC_y$ micro-particles before they reach the sublimation zone of the reactor. The growth rate is determined entirely by the ability to sublime the microparticles. The larger the size of the particles the more difficult it will be to sublime them and the higher the temperature and delta T which lead to deterioration of the grown crystal. If the size can be reduced, more material can be injected per time unit and hence the growth rate will increase while maintaining the same temperature and delta T. The silane and hydrocarbon components are thus ideally kept apart since the silane will decompose to form small liquid droplets that are easer to dissociate thermally and/or chemically.

The silane and hydrocarbon may be introduced together as is done in HTCVD where these gases form SiC microcrystals directly. However, in this case the separately introduced HCl will likely not be as effective in reducing particle size because the rate of reaction between Si and HCl is much greater than that of SiC and HCl. In a preferred embodiment, the silicon source, hydrocarbons and HCl are introduced separately into the environment, so that the HCl is allowed to react with the silicon droplets prior to joining with the hydrocarbon source. An additional separation such as a short cylindrical wall between the hydrocarbon flow and the HCl/silicon mix may be needed in order to obtain full effect of the chemical and thermal dissociation of the silicon clusters.

The invention further includes a silicon carbide crystal grown according to the inventive methods, and a semiconductor device incorporating such a silicon carbide crystal.

DESCRIPTION OF THE DRAWING

The invention is best understood from the following detailed description when read with the accompanying drawing.

FIG. 1 depicts a sublimation chamber according to an illustrative embodiment of the invention.

DETAILED DESCRIPTION OF THE INVENTION

Embodiments of the present invention provide a method of forming compounds of potentially higher quality than compounds formed by traditional methods. The higher quality may reflect lower micropipe concentration and/or more uniform structure throughout the crystal. The method can be applied to formation of many compounds, but is particularly suitable to the formation of silicon carbide. As such, the invention will be described as it relates to silicon carbide.

Prior art silicon carbide formation by HTCVD is accomplished by allowing a gas mixture of silicon-containing compounds and hydrocarbons to react in a chamber inlet section to form $Si_xC_y$ particles, and then passing these particles into a significantly hotter crucible where they sublime. There is little control of the particle size other than the pressure and the concentration of the precursor gases. In an illustrative embodiment of the present invention, however, silicon carbide cluster size is controlled by the addition of HCl and by separation of the Si source and the hydrocarbon source. Clusters of Si are allowed to form in the inlet region in order to make the material transport efficient, however, as soon as the clusters reach a hot zone of the growth chamber, these clusters or droplets are reduced in size by addition of HCl and by the heat before the flow of Si joins with a hydrocarbon flow. In a further embodiment of the invention, the HCl is omitted, particularly if the particle size is small enough so that the heat can dissociate the particles by itself without the aid of HCl. In an illustrative embodiment of the invention, the silicon source is transported in the chamber and the hydrocarbon is transported separated from the silicon source. The two streams of gas meet in the hot chamber, preferably in the sublimation zone that is the hottest part of the graphite assembly in the growth chamber. Since the temperature is significantly hotter when the gas flows meet, as compared to prior art methods, very small particles of SiC will be formed that may easily be sublimed. By eliminating or reducing pre-reaction between the silicon source and the hydrocarbons, and by additions of HCl brought in separately into the chamber, the size of silicon and silicon/carbon clusters can be reduced, allowing growth to occur at lower temperatures and/or higher pressures. There is a significant advantage to the separation of the source gases since the silane will form silicon droplets. It is relatively easy to dissociate these silicon droplets, for example by chemical and thermal means, which produce small particle sizes.

The silicon should meet the hydrocarbon flow at a distance from the surface on which the silicon carbide will be grown that is sufficient to allow the formed silicon-carbon particles to sublime before reaching the growing surface. In a preferred embodiment, the distance between the growing surface and the silicon/hydrocarbon meeting area is in the range of about 30 mm to 200 mm. In a more preferred embodiment, the range is about 70 mm to 120 mm.

Although in the preferred embodiment of the invention, the silicon source is introduced into the chamber separately from all hydrocarbons, the invention includes a method wherein some hydrocarbons are added initially to the silicon source before the silicon source interacts with the main stream of hydrocarbons. In an illustrative embodiment, the amount of one or more hydrocarbons initially mixed with the silicon source is less than the amount in the main hydrocarbon flow. The flow rate of this second, smaller quantity of hydrocarbon is preferably less than 5 sccm.

FIG. 1 shows a sublimation chamber 100 according to an illustrative embodiment of the invention. A seed crystal 102 is introduced onto a sample holder 104. The seed crystal and adjacent area is at a lower temperature than the chamber cavity. A single crystal 106 is then formed on seed crystal 102 by a sublimation process.

The sublimation process will be described as it relates to the formation of a silicon/carbon crystal. Broadly, the silicon and hydrocarbons react and form microcrystals before interacting at, or with, the substrate on which the crystal will be grown.

In an illustrative embodiment, a silicon source is introduced into an environment such as in chamber 100, forming silicon particles. FIG. 1 shows the silicon source being introduced through openings 108. The silicon source is preferably in a carrier gas such as helium, argon or other inert gas.

One or more hydrocarbons are preferably introduced into the environment separately from the silicon source. The hydrocarbon is transported via a carrier gas such as hydrogen, an inert gas or a combination thereof. The hydrogen decreases or eliminates deposition of carbon on the walls. When the hydrocarbon flow joins with the silicon flow small silicon carbide particles will form. The hydrocarbon is preferably ethylene but may be any other hydrocarbon or a mixture thereof.

FIG. 1 shows the hydrocarbons being introduced through openings 110. By introducing the hydrocarbons and the silicon into the chamber separately, the formation of large microcrystals or clusters can be reduced or eliminated. Optionally, walls 122 may be provided to further separate gas streams. As will be understood by those skilled in the art, other chamber configurations are possible as long as sufficiently small microcrystals can be formed.

The separate silicon source produces liquid particles that are relatively easily dissociated. These droplets will readily dissolve when they reach high temperatures, allowing the hydrocarbons to easily react with them.

In an exemplary embodiment of the invention, a dissociation enhancer, such as hydrogen chloride, is introduced in the chamber through openings 112 to aid in the dissolving of silicon particles. The HCl may also facilitate dissociation of silicon/carbon compound crystals, thereby keeping them small. Introduction of HCl must be carefully controlled so that it does not react markedly with the crystal being formed. As shown in FIG. 1, the HCl is released into the chamber to interact with the silicon source prior to it joining the hydrocarbon flow.

Silane and the hydrocarbon may also be brought into a growth chamber together, and subsequently mixed with HCl to reduce particle size, however, the effect is not as significant as when the silicon and hydrocarbon is brought in separately. However, a small trickle of a hydrocarbon may be favorably added into the silicon flow in order to keep the particles more stable in case there is a problem with high levels of depositions on the sidewalls of the inlet. In this case the rest of the hydrocarbons are added separately as described previously.

The silicon source can be any silicon-containing compound from which silicon can be extracted for reaction with carbon. Examples include, silane, trichlorosilane, silicon tetrachloride, $Si_2Cl_6$, $Si_3Cl_8$ or a combination of two or more of the aforementioned compounds. These compounds with the exception of silane will not decompose unless they are in contact with hydrogen. By separating them from the hydrogen until they reach a hot zone where sublimation or thermal dissociation occurs, cluster formation can be kept at a minimum. The result of the above-mentioned arrangement is a relatively small cluster size, which can result in a lower growth temperature or temperature gradient, a higher growth rate, and a better quality crystal. Preferably the growth temperature is below about 2400° C., and more preferably below about 2200° C.

The hydrocarbons are preferably in a carrier stream such as a stream containing hydrogen. The hydrogen can keep the hydrocarbons from being deposited as pyrolytic graphite. In a further embodiment the carrier gas contains helium.

The following are illustrative flow rate ranges:
silicon source: 300 standard cubic centimeter/minute–1 liter/minute
hydrocarbon: 50 sccm–500 sccm
hydrogen chloride: 100 sccm–300 sccm
helium: 1 liter/min–3 liters/min The flow rates will depend, at least in part, on the size of the reactor.

The concentration of the silicon source is preferably greater than the concentration of the one or more hydrocarbons.

The invention further includes a crystal formed according to the methods described herein, and a semiconductor device having such a crystal. The semiconductor device may be or include for example, a complimentary metal oxide semiconductor (CMOS) device, micro-electro-mechanical (MEM) device, field effect transistor (FET), bipolar junction transistor (BJT), insulated gate bipolar transistor (IGBT), gate turn-off thyristor (GTO), or Schottky drode.

While the invention has been described by illustrative embodiments, additional advantages and modifications will occur to those skilled in the art. Therefore, the invention in its broader aspects is not limited to specific details shown and described herein. Modifications, for example, to the types of silicon sources and hydrocarbons, process parameters, types of crystals formed and crystal growth equipment, may be made without departing from the spirit and scope of the invention. Accordingly, it is intended that the invention not be limited to the specific illustrative embodiments, but be interpreted within the full spirit and scope of the appended claims and their equivalents.

The invention claimed is:

1. A method of forming a silicon carbon compound on a silicon carbon growth surface comprising:
   introducing a silicon source into a first region of an environment;
   forming silicon particles in the first region;
   introducing one or more hydrocarbons into a second region of the environment to form silicon-carbon particles, wherein the one or more hydrocarbons are introduced separately from the silicon source; and
   introducing hydrogen chloride into the environment so that the silicon particles meet with the hydrogen chloride before meeting with the one or more hydrocarbons,
   wherein the one or more hydrocarbons are introduced at a distance from the growing surface sufficient to allow the formed silicon-carbon particles to sublime before reaching the silicon carbon growth surface, thereby forming one or more silicon carbon compounds on the silicon carbon growth surface.

2. The method of claim 1 wherein the hydrogen chloride is introduced into the environment separately from the silicon source and the hydrocarbon source.

3. The method of claim 1 wherein the silicon source is selected from the group consisting of silane, trichlorosilane, silicon tetrachloride, $Si_2Cl_6$, $Si_3Cl_8$ and a combination of two or more of the aforementioned compounds.

4. The method of claim 3 wherein the silicon source is silane.

5. The method of claim 1 wherein the silicon source is a chlorosilane and the method further comprises:
   introducing the hydrogen into the environment.

6. The method of claim 1 wherein the one or more hydrocarbons are in a carrier stream containing hydrogen.

7. The method of claim 1 wherein the concentration of silicon is greater than the concentration of the one or more hydrocarbons.

8. The method of claim 1 wherein the one or more hydrocarbons contains ethylene.

9. The method of claim 1 wherein the silicon source is transported in a carrier gas.

10. The method of claim 9 wherein the carrier gas is an inert gas.

11. The method of claim 10 wherein the inert gas is helium.

12. The method of claim 1 wherein the silicon source and the one or more hydrocarbons are kept substantially separate until they reach the sublimation zone.

13. The method of claim 1 wherein a second amount of one or more hydrocarbons is introduced into the environment with the silicon source in addition to the one or more hydrocarbons being introduced into the environment separately from the silicon source.

14. The method of claim 13 wherein the flow of the second amount of hydrocarbons is less than 5 sccm.

15. The method of claim 1 performed at a temperature below about 2400° C.

16. The method of claim 15 performed at a temperature of below about 2100° C.

17. The method of claim 1 wherein the flow rate of silicon source is in a range of about 300 standard cubic centimeter/minute–1 liter/minute.

18. The method of claim 1 wherein the flow rate of hydrocarbon is in the range of about 50 sccm–500 sccm.

19. The method of claim 1 wherein the flow rate of hydrogen chloride is in the range of about: 100 sccm–300 sccm.

20. The method of claim 1 wherein the flow rate of helium is in the range of about 1 liter/mm–3 liters/min.

21. The method of claim 1 wherein the silicon source and the hydrocarbon source are physically separated within a growth chamber until they reach an area of predetermined temperature.

22. The method according to claim 1 wherein the silicon and hydrogen chloride are physically separated from the hydrocarbon flow within a growth chamber until they reach an area of predetermined temperature.

23. The method according to claim 1 wherein the silicon and hydrogen chloride are physically separated from the hydrocarbon flow within a growth chamber until the particle size is decreased to a predetermined size.

24. The method of claim 1 wherein the hydrocarbons are introduced into the environment at a distance of about 30 mm to 200 mm from the silicon carbon growth surface.

25. The method of claim 1 wherein the hydrocarbons are introduced into the environment at a distance of about 70 mm to 120 mm from the silicon carbon growth surface.

26. The method of claim 1, wherein the silicon source includes chlorine, and wherein the silicon source is kept separate from any hydrogen until the silicon source reaches a hot zone in the environment where sublimation or thermal dissociation occurs.

27. A method of forming a silicon carbon compound comprising:
   introducing a silicon source into an environment;
   forming silicon particles;
   introducing one or more hydrocarbons into the environment;
   dissociating at least some of the silicon particles, wherein the dissociation is enhanced by exposure to a chlorine containing gas;

forming silicon carbon particles from silicon dissociated from the silicon particles and carbon from the one or more hydrocarbons;

subliming the silicon carbon particles; and forming the silicon carbon compound on a growth surface from the sublimed silicon carbon particles.

28. The method of claim 27 wherein the chlorine containing gas is hydrogen chloride.

29. The method of claim 27 wherein the silicon source is selected from the group consisting of silane, trichlorosilane, silicon tetrachloride, $Si_2Cl_6$, $Si_3Cl_8$ and a combination of two or more of the aforementioned compounds.

30. The method of claim 29 where the silicon source is silane.

* * * * *

UNITED STATES PATENT AND TRADEMARK OFFICE
CERTIFICATE OF CORRECTION

PATENT NO. : 7,147,713 B2
APPLICATION NO. : 10/426200
DATED : December 12, 2006
INVENTOR(S) : Olof Claes Erik Kordina Page 1 of 1

It is certified that error appears in the above-identified patent and that said Letters Patent is hereby corrected as shown below:

Title Page should read
Item 74: Correction --Myers Bigel Sibley & Sajovec, P.A.--

Other Publications item 56 should read
Cont. page 2: Correction --Kimoto, et al., "Recent Achievements and Future Challenges in SiC--

Column 6,
Line 35: Correct [1 liter/mm-3] to read --1 liter/min-3--

Signed and Sealed this

Twenty-fourth Day of April, 2007

JON W. DUDAS
*Director of the United States Patent and Trademark Office*